United States Patent
Kiuchi

(10) Patent No.: US 7,667,939 B2
(45) Date of Patent: Feb. 23, 2010

(54) BUS DRIVER INCLUDING CONTROL CIRCUIT FOR OVERVOLTAGE PROTECTION

(75) Inventor: Hideki Kiuchi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 159 days.

(21) Appl. No.: 11/898,459

(22) Filed: Sep. 12, 2007

(65) Prior Publication Data

US 2008/0068770 A1 Mar. 20, 2008

(30) Foreign Application Priority Data

Sep. 15, 2006 (JP) ............... 2006-250194

(51) Int. Cl.
*H02H 3/22* (2006.01)
(52) U.S. Cl. .................... 361/91.1; 361/111
(58) Field of Classification Search .......... 361/56, 361/111, 91.1, 91.5
See application file for complete search history.

(56) References Cited

U.S. PATENT DOCUMENTS

| 5,642,059 A | * | 6/1997 | Scoones ............. 326/86 |
| 6,265,926 B1 | * | 7/2001 | Wong ............... 327/318 |
| 6,320,735 B1 | * | 11/2001 | Anderson ............ 361/111 |
| 6,639,774 B1 | | 10/2003 | Stroebele et al. |
| 6,970,336 B2 | * | 11/2005 | Stockinger et al. ...... 361/56 |

FOREIGN PATENT DOCUMENTS

JP 2002-532961 10/2003

* cited by examiner

*Primary Examiner*—Danny Nguyen
(74) *Attorney, Agent, or Firm*—McGinn IP Law Group, PLLC

(57) ABSTRACT

A bus driver device is provided with a bus driver circuit connected to a bus line and a overvoltage protection section connected between the bus line and a power supply line. The overvoltage protection section has an overvoltage protection function for the bus line. Further, the bus driver device is provided with a switching circuit for on/off-controlling the overvoltage protection function based on a voltage of the bus line and a voltage of the power supply wiring.

6 Claims, 9 Drawing Sheets

BUS DRIVER INCLUDING CONTROL CIRCUIT FOR OVERVOLTAGE PROTECTION

BACKGROUND OF THE INVENTION

1. Field of the Invention

The present invention relates to an integrated circuit for an in-vehicle network communication system such as a CAN system or a FlexRay system or all communication systems to which an overvoltage may be applied.

2. Description of the Related Art

In an in-vehicle network for performing various controls of a car, a controller area network (CAN) and a local interconnect network (LIN) are now prevailed as world standards and used for body control, temperature adjustment control, dashboard control, navigation, various sensor controls, motor control, chassis control, and the like. In contrast, there is a next-generation in-vehicle communication protocol FlexRay system. The FlexRay system has a feature in that the reliability of data transmission is higher than that in the CAN. To be specific, a data transmission rate is 10 Mbits/seconds in maximum which corresponds to ten times that of the CAN. A time-triggered system with little delay is employed for data transmission. Two control large-scale integration (LSI) circuits and two transmission and reception LSI circuits per node are mounted and double transmission media are provided, thereby improving the reliability.

In order to prevent an LSI circuit from being broken by a noise applied thereto, a circuit for protecting the LSI circuit from an overvoltage is provided in an output circuit such as a FlexRay bus driver. An example of a conventional overvoltage damping circuit for two-wire bus system is described in JP 2002-532961 A. FIG. 8 shows the damping circuit described in JP 2002-532961 A. In order to damp a level of an overvoltage applied by resonance, Zener diodes are used in the damping circuit. To be specific, as shown in FIG. 8, when an overvoltage "A" generated by high-frequency (HF) radiation with respect to a reference potential 210 is applied to nodes 207, 208, and 209, resistors 203 and 204 are connected with the reference potential at a potential (each of forward and backward voltage) in which Zener diodes 205 and 206 are turned on, thereby damping a level of the overvoltage applied to the nodes 207, 208, and 209.

In JP 2002-532961 A, the Zener diodes are used to prevent the application of the overvoltage. However, it is difficult to embed a Zener diode having a low voltage of, for example, approximately 7 V in the LSI circuit owing to the severe limitation of process. Therefore, it is expected to construct an overvoltage reduction and protection circuit using high-withstand voltage MOS transistors instead of the Zener diodes.

A "OUTPUT CIRCUIT AND PROTECTION CIRCUIT" section of FIG. 9 is a circuit diagram showing an example in which the overvoltage reduction and protection circuit is realized without the use of the Zener diodes. When high-withstand voltage transistors and high-withstand voltage resistors are used instead of the Zener diodes, the high-withstand voltage transistors and the high-withstand voltage resistors can be embedded in the LSI circuit. The operational principle is substantially identical to that in the case where the Zener diodes are used.

As shown in FIG. 9, overvoltage reduction and protection circuits 120P and 120M are provided to output wirings for differential signals BP and BM from an output circuit 110. The overvoltage reduction and protection circuit 120P includes a Pch-transistor P101 and a resistor R101 which are connected in series between a power supply wiring and one of the output wirings. The overvoltage reduction and protection circuit 120P further includes a resistor R102 and an Nch-transistor N101 which are connected between the one of the output wirings and a ground wiring. Similarly, the overvoltage reduction and protection circuit 120M includes a Pch-transistor P102, a resistor R103, a resistor R104, and an Nch-transistor N102.

When a potential of each of the differential signals BP and BM is within a range of 0 V to 5 V, currents do not flow into the overvoltage reduction and protection circuits 120P and 120M. That is, the normal operations of the overvoltage reduction and protection circuits 120P and 120M are not influenced. When the potential of each of the differential signals BP and BM becomes equal to or larger than approximately 5.7 V, a diode formed between substrates and the Pch-transistors P101 and P102 is turned on. Then, a current (hereinafter referred to as substrate current) corresponding to each of the differential signals BP and BM flows in a power supply wiring direction (through each path indicated by reference numeral 131 in FIG. 9). Therefore, only when a positive noise is applied, a common mode impedance reduces.

When the potential of each of the differential signals BP and BM becomes equal to or smaller than approximately −0.7 V, a diode formed between substrates of the Nch-transistors is turned on. Then, a substrate current corresponding to each of the differential signals BP and BM flows in a ground wiring direction (through each path indicated by reference numeral 132 in FIG. 9). Therefore, only when a negative noise is applied, a common mode impedance reduces.

A "BP, BM VOLTAGE WAVE PATTERN" of FIG. 9 shows the swing of the potential of each of the differential signals BP and BM. Before and after measures, a common mode swing width of each of the differential signals BP and BM narrows. The conventional overvoltage reduction and protection circuit has a merit in that the circuit is easily embedded in the LSI circuit because it is unnecessary to use the Zener diode having the low voltage.

For example, in the case of the FlexRay system, a specification of the FlexRay defines a limitation of a bus leakage current. In the specification, a current flowing into each of the output wirings for differential signals BP and BM at VCC=0 V and BP=BM=5 V is equal to or smaller than 25 µA. However, according to the circuit structure shown in FIG. 9, a current equal to or larger than the limitation of bus leakage current flows into each of the substrates of the Pch-transistors.

That is, in the conventional overvoltage reduction and protection circuit shown in FIG. 9, the protection Pch-transistors are provided on the VCC side. Therefore, when a power supply for the LSI circuit is turned off and thus a constant potential is being applied to buses, the current (substrate current) flows from the buses through the diode formed between the substrates and the Pch-transistors. Then, as described above, a current is significantly deviated from the specification in the FlexRay system. Thus, when the power supply for the LSI circuit is turned off, the current flowing from the buses increases, so it is difficult to realize overvoltage protection in a system in which the bus leakage current is limited, such as the FlexRay system.

As described above, it is difficult to embed the Zener diode in the LSI circuit owing to the severe limitation of process. Therefore, a circuit capable of cutting off an inflow current at the time of turning OFF the power supply while the overvoltage protection is realized using MOS transistors is required.

SUMMARY

The present invention seeks to solve one or more of the above problems, or to improve upon those problems at least in part.

In one embodiment, a bus driver device includes a bus driver circuit connected to a bus line, a power supply wiring, an overvoltage protection section connected between the bus line and the power supply wiring, which has an overvoltage protection function for the bus line and a switching circuit for on/off-controlling the overvoltage protection function based on a voltage of the bus line and a voltage of the power supply wiring.

According to the present invention, the protection function of the overvoltage protection section is turned off based on a voltage of the bus line and a voltage of the power supply wiring, so an excess leakage current does not flow. The protection function is turned on based on a voltage of the bus line and a voltage of the power supply wiring, so an overvoltage applied to the bus line can be reduced to protect an LSI circuit.

BRIEF DESCRIPTION OF THE DRAWINGS

The above and other objects, advantages and features of the present invention will be more apparent from the following of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In Embodiment 1, the present invention is applied to an output circuit in a two-wire communication system such as a FlexRay system. The output circuit (hereinafter referred to as overvoltage protection circuit) has a function for protecting the LSI circuit from an overvoltage which exceeds a withstand voltage of the LSI circuit at a time when a noise is inputted from an outside to a communication terminal of the LSI circuit and a function for cutting off a current flowing from a bus while a power supply of the LSI circuit is not turned on.

Figure 1:
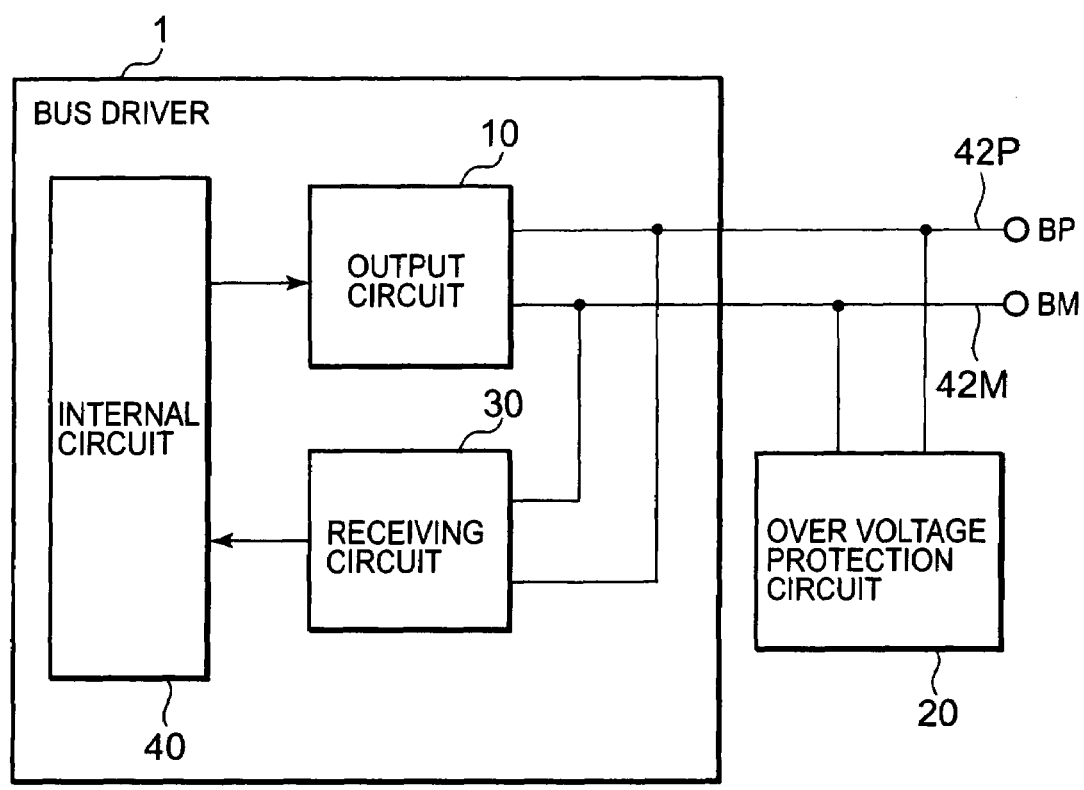
FIG. 1 shows a bus driver which is an example of a circuit to which an overvoltage protection circuit in Embodiment 1 of the present invention is applied.

FIG. 1 shows a bus driver which is an example of a circuit to which an overvoltage protection circuit in Embodiment 1 of the present invention is applied. In this embodiment, an example of the two-wire communication system will be described. However, the present invention is not limited to this. That is, the overvoltage protection circuit in this embodiment is not limited to the output circuit in the two-wire communication system and can be applied to an output circuit in an one-wire communication system. The present invention is suitably applied to all communication systems to which an overvoltage may be inputted.

As shown in FIG. 1, a bus driver 1 includes an output circuit 10, a receiving circuit 30, and an internal circuit 40. The output circuit 10 converts a single signal inputted from the communication controller (internal circuit 40) whish is an upper-layer circuit into differential signals (BP and BM) and outputs the differential signals to communication bus lines 42P and 42M. The receiving circuit 30 logically determines the differential signals from the communication bus lines 42P and 42M and outputs a single signal indicating a result obtained by logical determination to the upper-layer circuit.

An overvoltage protection circuit 20 in this embodiment detects a common mode level on the communication bus lines 42P and 42M and protects the LSI circuit from an overvoltage applied thereto. Not a Zener diode but MOS transistor is used as an element having a protection function. In order to prevent an increase in bus leakage current caused by the overvoltage, the overvoltage protection circuit 20 further includes a bus leakage prevention circuit.

Figure 2:
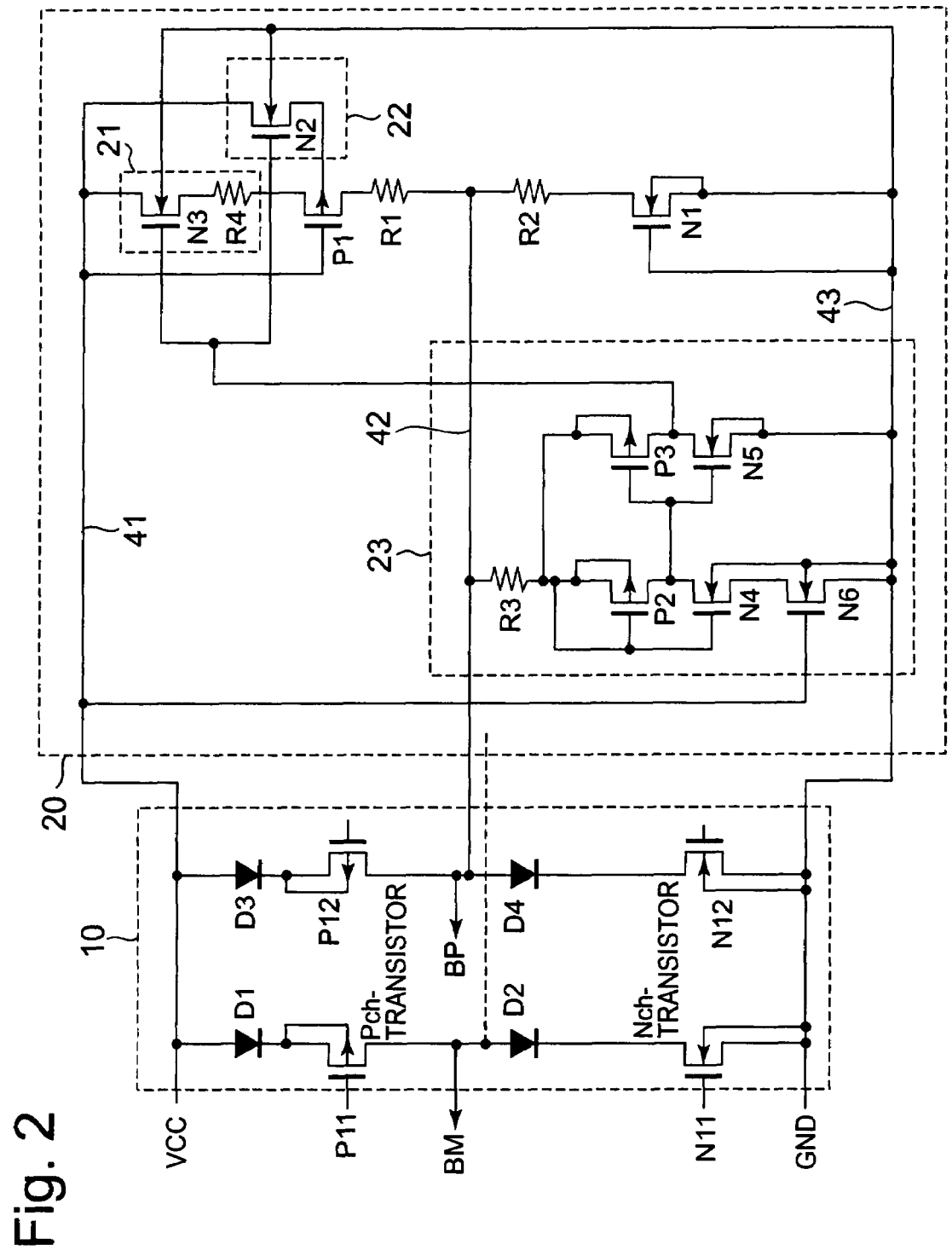
FIG. 2 shows in detail the overvoltage protection circuit in Embodiment 1 of the present invention.

FIG. 2 is a detailed diagram showing the overvoltage protection circuit in this embodiment. Although each of FIGS. 2 to 5 and 7 shows only one side (BP side) of the differential outputs BP and BM of the overvoltage protection circuit, the same structure is expected on the BM side.

The overvoltage protection circuit 20 is connected between a bus line (output wiring) 42 and a power supply wiring 41. The overvoltage protection circuit 20 includes: overvoltage protection sections P1 and N2 each having an overvoltage reduction function for reducing an overvoltage on the bus line 42 to protect the LSI circuit; and switching circuits 21, 23 for on/off-controlling the overvoltage reduction function of the overvoltage protection section based on a potential on the bus line 42. The switching circuit includes: a first transistor N3 for bus leakage prevention which is connected between the overvoltage protection section and the power supply wiring 41; and a control circuit 23 for on/off-controlling the first transistor based on the voltage on the bus line 42.

The overvoltage protection section includes a second transistor P1 connected between the bus line 42 and the power supply wiring 41 and a third MOS transistor N2 connected between a back gate of the second transistor and the power supply wiring 41. The control circuit 23 includes: voltage detection section P2, N4, N6) for detecting voltages on the power supply wiring 41 and the bus line 42; and an inverter (P3 and N5) for on/off-controlling the first transistor based on a result obtained by the voltage detection section. The voltage detection section include first voltage monitor section (P2 and N4) for detecting the voltage on the bus line 42 and a second voltage monitor section N6 connected between the first voltage monitor section and the ground wiring 43, for monitoring the voltage on the power supply wiring 41.

The control circuit 23 detects the potentials on the power supply wiring 41 and the bus line 42 and on/off-controls the Nch-transistors N2 and N3 based on a result obtained by detection, so the bus leakage can be prevented. Hereinafter, the overvoltage protection circuit will be specifically described.

The overvoltage protection circuit 20 includes: resistors R1, R2, R3, and R4 for mainly reducing the overvoltage, the Pch-transistor P1, and a Nch-transistor N1; and the Pch-transistors P2, P3, and Nch-transistors N2 to N6 for bus leakage prevention. That is, as in the conventional case, a first bus leakage prevention circuit 21 and a second bus leakage prevention circuit 22 are provided for the Pch-transistor P1 and the resistor R1 which are connected between the power supply wiring 41 and the bus line 42 and the resistor R2 and the Nch-transistor N1 which are connected between the bus line 42 and the ground wiring 43. The first bus leakage prevention circuit 21 and the second bus leakage prevention circuit 22 are controlled by the control circuit 23 which generates a signal corresponding to the potential on the communication bus line.

The first bus leakage prevention circuit 21 includes the Nch-MOS transistor N3 and the resistor R4 which are connected in series between the power supply wiring 41 and the Pch-transistor P1. The Nch-MOS transistor N3 is turned off based on the voltage on the bus line 42 to cut off a bus leakage current flowing through the Pch-transistor P1 which is turned on.

The second bus leakage prevention circuit 22 includes the Nch-transistor N2 whose drain is connected with the power supply wiring 41 and source is connected with a back gate of the Pch-transistor P1. A gate of the Nch-transistor N2 is connected with the control circuit 23 together with a gate of the Nch-transistor N3. The Nch-transistor N2 is on/off-controlled based on the voltage on the bus line 42.

The control circuit 23 includes the resistor R3, the Pch-transistors P2 and P3, and the Nch-transistors N4 to N6. One end of the resistor R3 is connected with the bus line 42. The voltage detection section and the inverter are connected in parallel between the resistor R3 and the ground wiring 43. That is, the Pch-transistor P2, the Nch-transistor N4, and the Nch-transistor N6 which are included in the voltage detection section for detecting the voltage on the bus line 42 are connected in series between the resistor R3 and the ground wiring 43. Gates of the Pch-transistor P2 and the Nch-transistor N4 are commonly connected with the other end of the resistor R3. A gate of the Nch-transistor N6 is connected with the power supply wiring 41.

The Pch-transistor P3 and the Nch-transistor N5 which are included in the inverter are connected in series between the resistor R3 and the ground wiring 43. Gates of the Pch-transistor P3 and the Nch-transistor N5 are connected with a drain of the Pch-transistor P2 (drain of the Nch-transistor N4) from which a result obtained by voltage detection is outputted. The Nch-transistors N2 and N3 are on/off-controlled based on a high-level signal or a low-level signal which is outputted based the result obtained by voltage detection section.

In the overvoltage protection circuit 20, when the voltage on the communication bus line 42 is significantly swung by a noise, a current flows through a diode formed between substrates and the transistors P1 and N1, thereby reducing a voltage level on the communication bus line 42. The current is determined based on values of the resistors R1 to R4.

A bus leakage condition (current flowing into each of output wirings for the differential signals BP and BM at VCC=0 V and BP=BM=5 V is equal to or smaller than 25 μA) is satisfied, so a path between a back gate terminal of the transistor P1 and the power supply wiring 41 is cut off by the transistor N2 to be controlled. The control is performed by the inverter P3 and N5 switched based on the potential on the communication bus line 42 such that transistors N2 and N3 are turned off in the bus leakage condition and turned on at the time of application of a positive noise.

Figure 3:
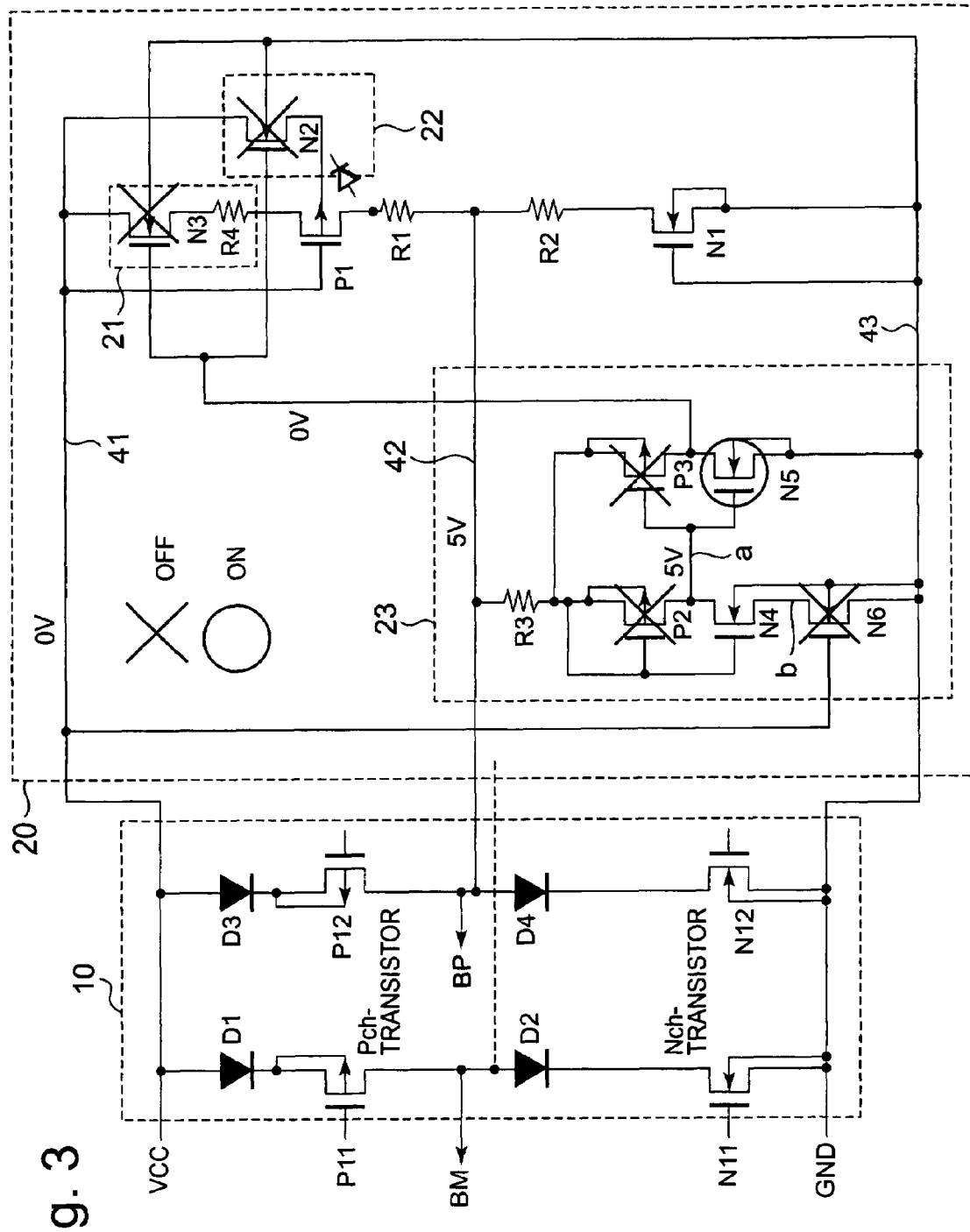
FIG. 3 shows a DC circuit operation in a bus leakage condition (VCC=0 V and BP=BM=5 V)
Figure 4:
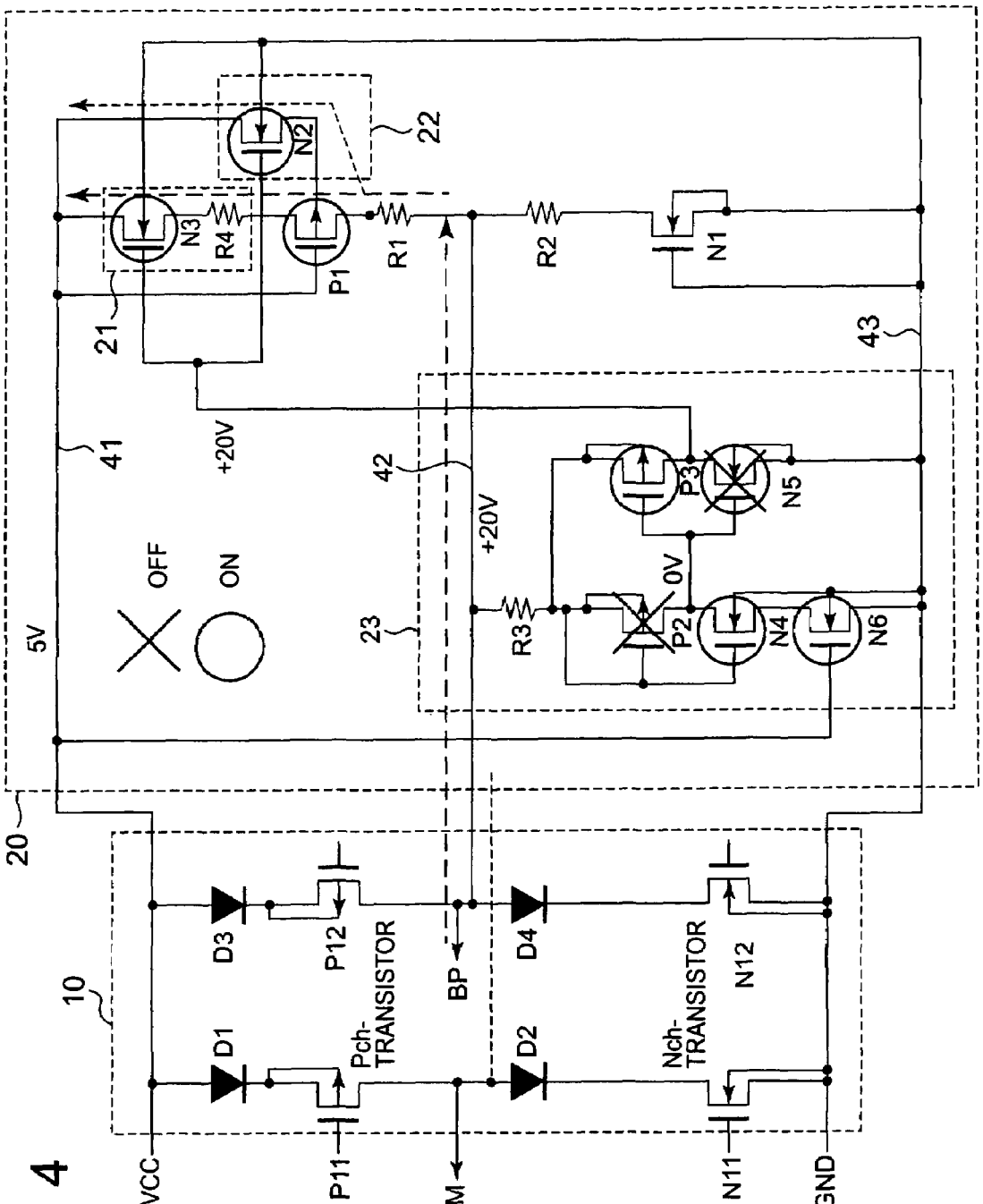
FIG. 4 shows a DC circuit operation in a case where a voltage of +20 V is applied to a communication bus line (VCC=5 V and BP=BM=+20 V)
Figure 5:
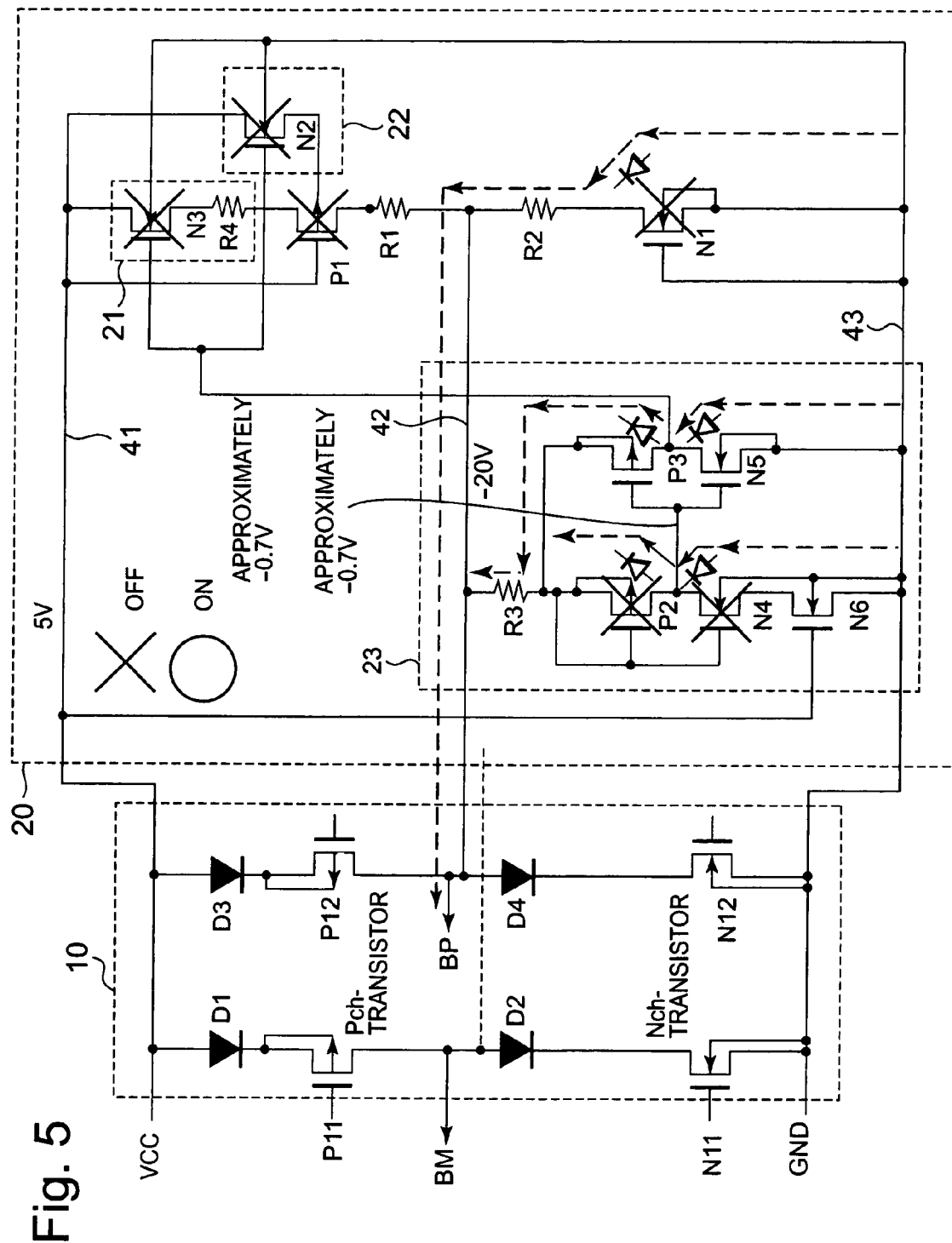
FIG. 5 shows a DC circuit operation in a case where a voltage of −20 V is applied to the communication bus line (VCC=5 V and BP=BM=−20 V)
Figure 6:
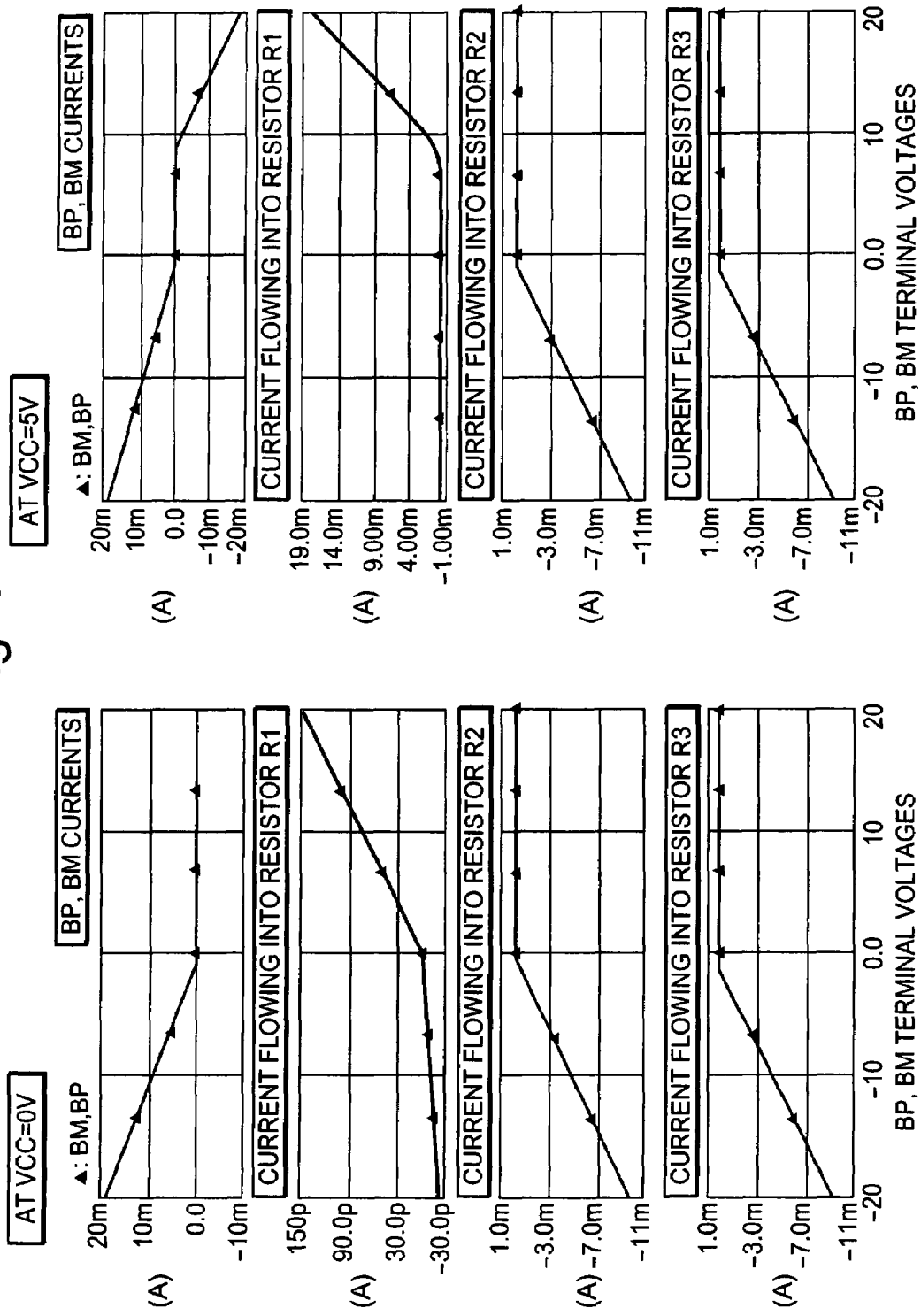
FIG. 6 shows results obtained by monitoring currents flowing into a BM terminal, a BP terminal, and each resistor at a power supply voltage VCC=0 V and 5 V.

Next, the operation of the overvoltage protection circuit in this embodiment will be described. FIGS. 3 to 5 are explanatory diagrams showing the operation of the overvoltage protection circuit. FIG. 6 shows results obtained by monitoring currents flowing into a BM terminal, a BP terminal, and each resistor at the time of operation.

FIG. 3 shows a DC circuit operation in the bus leakage condition (VCC=0 V and BP=BM=5 V). As shown in FIG. 3, in the bus leakage condition, the voltage on the power supply wiring 41 is 0 V and the voltage on the communication bus line 42 is 5 V, so the Pch-transistor P2 and the Nch-transistor N6 are turned off. Then, although the Nch-transistor N4 is turned ON, a current does not flow. At this time, a voltage of a node "b" between the Nch-transistor N4 and the Nch-transistor N6 is undefined. An impedance of the Nch-transistor N6 at the time when the Nch-transistor N6 is turned OFF is far larger than an impedance of the Pch-transistor P2 at the time when the Pch-transistor P2 is turned OFF, so a drain potential "a" of the transistor P2 becomes constant in the vicinity of 5 V.

Therefore, a voltage of approximately 5 V is applied to a gate of the inverter, so the Nch-transistor N5 is turned ON to output a signal (Low). Then, the Nch-transistors N2 and N3 are turned off. Although the transistor P1 is turned on, the transistor N3 is turned off, with the result that a current does not flow. A current flowing into the substrate of the transistor P1 is also cut because the transistor N2 connected with the back gate of the transistor P1 is turned off. Thus, the bus leakage does not occur.

FIG. 6 shows results obtained by current monitoring at the power supply potential VCC=0 V and 5 V. The abscissa indicates BP and BM terminal voltages on the bus line 42. The ordinate indicates a current flowing into each of the BP terminal, the BM terminal, the resistor R1, the resistor R2, and the resistor R3. When VCC is 0 V and the voltage at each of the BP and BM terminals is 5 V, each of BP and BM terminal currents becomes 0, so the bus leakage condition is satisfied.

FIG. 4 shows the DC circuit operation in the case where a voltage of +20 V is applied to the communication bus line 42 (VCC=5 V and BP=BM=+20 V). As shown in FIG. 4, the inverter is operated at +20 V. That is, when the voltage of +20 V is applied to the bus line 42, the transistor P2 is turned off and the transistors N4 and N6 are turned on. Then, the drain potential of the transistor P2 becomes 0 V, so the transistor P3 of the inverter is turned on and the transistor N5 thereof is turned off, thereby outputting a high-level signal. Then, the transistors N2 and N3 are turned on, so a path in which a current flows between the transistor P1 and the power supply wiring 41 and a path in which a current flows into the substrate of the transistor P1 are formed. Therefore, an overvoltage reduction effect is obtained. At this time, the transistor P1 is not completely turned on.

Referring to FIG. 6, when the voltage of +20 V is applied to the bus line 42 in the case of VCC=5 V, a current flows into the resistor R1, thereby reducing the overvoltage.

FIG. 5 shows the DC circuit operation in the case where a voltage of −20 V is applied to the communication bus line 42 (VCC=5 V and BP=BM=−20 V). As shown in FIG. 5, although the transistor N6 is turned on, the transistor N4 is turned off because the voltage on the bus line 42 is −20 V. At this time, a substrate side diode of the transistor N4 is turned ON and a drain potential thereof becomes approximately −0.7 V. That is, although a gate potential of the inverter becomes −0.7 V and the transistors P3 and N5 are turned off, a diode formed between the substrates thereof is turned on, so a current flows from the ground wiring 43 to the bus line 42. At this time, an output of the inverter is approximately −0.7 V, so the transistors N2 and N3 are turned off.

As described above, when the diode formed between the substrate and the Nch-transistor N1 and the diode formed between the substrates and the transistors P3 and N5 of the inverter are turned on, a current flow path is produced, so an effect is obtained in which the overvoltage applied to the communication bus line 42 is reduced. That is, referring to FIG. 6, when the voltage on the bus line 42 becomes lower in the case of VCC=5 V, a current flows into each of the resistors R2 and R3.

In this embodiment, when bus leakage prevention is to be employed for the overvoltage protection circuit, not the Zener diodes but the MOS transistors can be used as protection elements, so the MOS transistors are easily embedded in the LSI circuit. When the diodes or the MOS transistors are inserted as protection elements for the power supply wiring 41 side, the increase in bus leakage is a conventional problem. However, when the transistors N2 and N3 which are on/off controlled based on the results obtained by detecting the voltages on the bus line 42 and the power supply wiring 41 are provided, the bus leakage current can be controlled.

Embodiment 2

Figure 7:
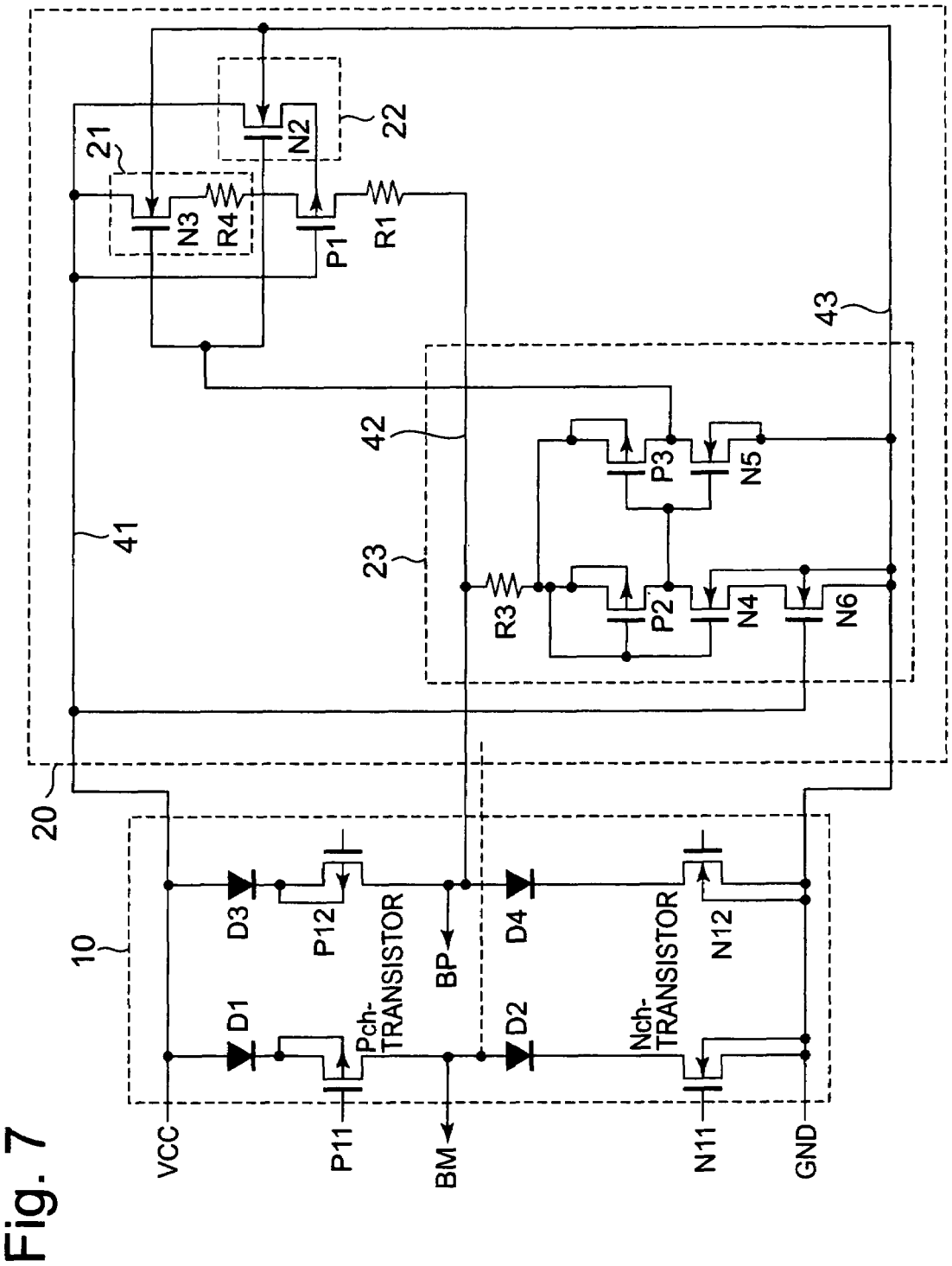
FIG. 7 shows an overvoltage protection circuit in Embodiment 2 of the present invention.
Figure 8:
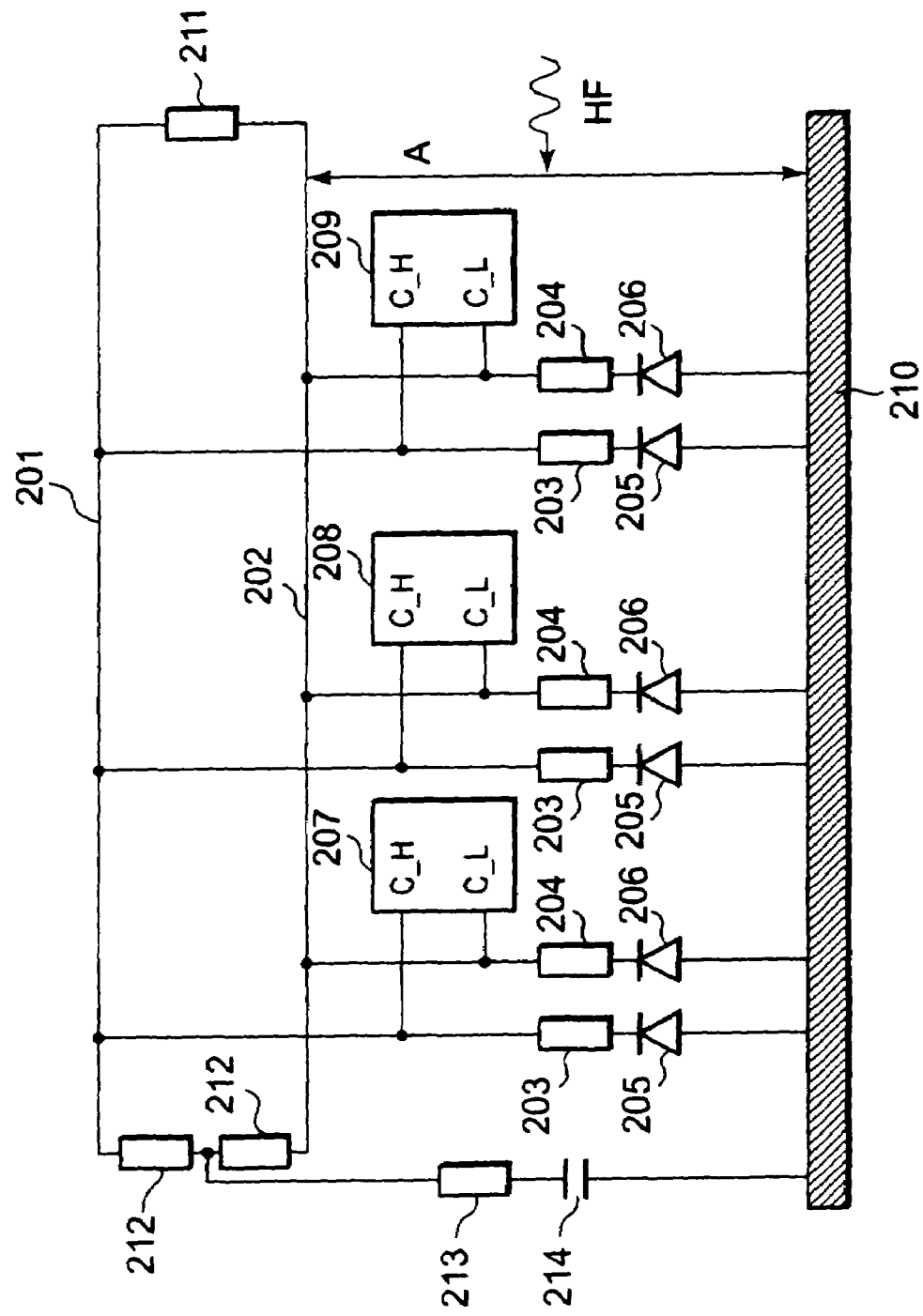
FIG. 8 shows a damping circuit described in JP 2002-532961 A.
Figure 9:
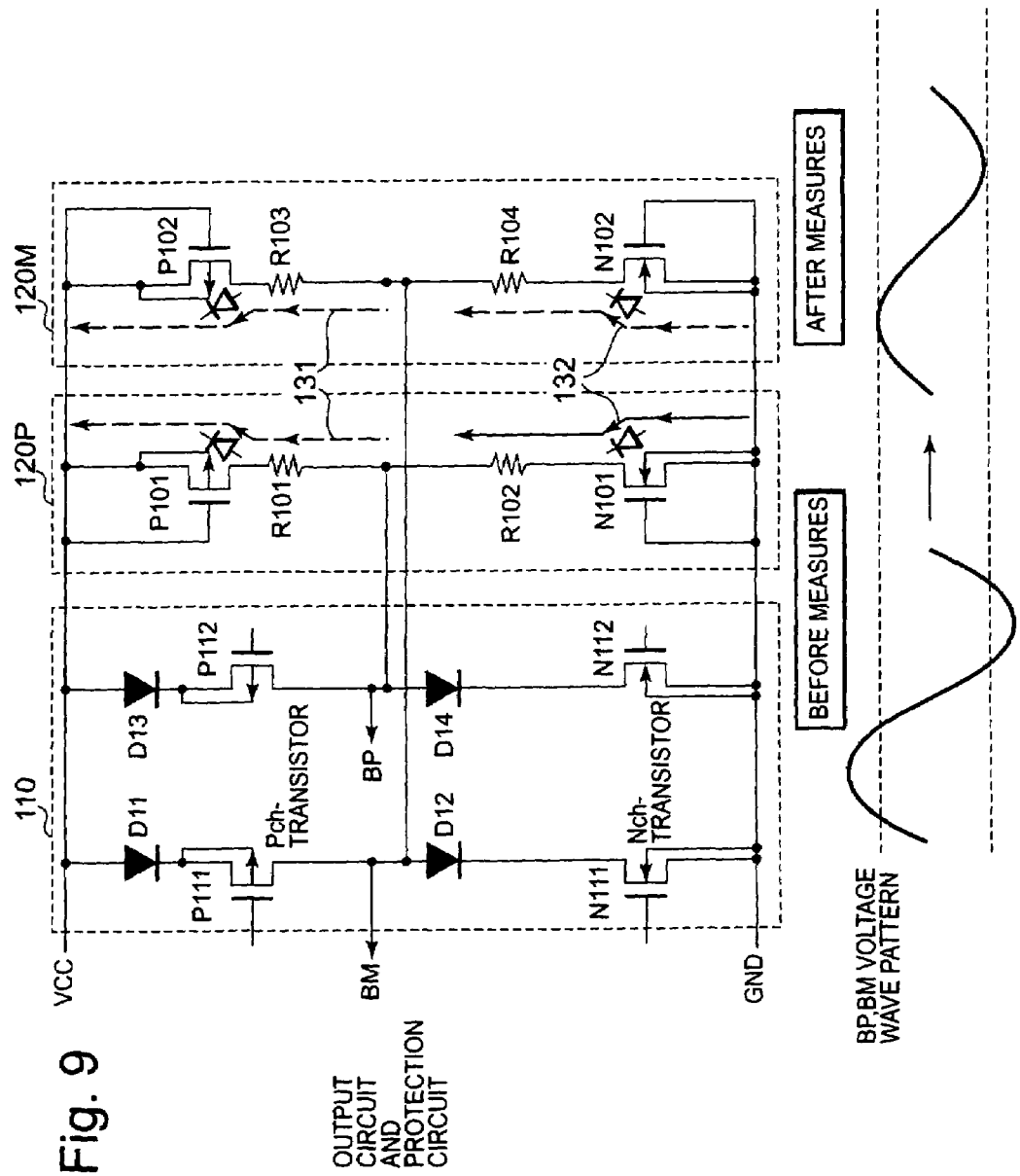
FIG. 9 includes a circuit diagram showing an example in which the overvoltage protection circuit is realized without using Zener diodes and a schematic diagram showing the swing of potential of each of differential signals BP and BM.

Next, Embodiment 2 of the present invention will be described. FIG. 7 shows an overvoltage protection circuit according to this embodiment. In this embodiment, the resistor R2 and the transistor N1 are omitted from the overvoltage protection circuit 20 according to Embodiment 1.

In FIG. 7 because the resistor R2 and the transistor N1 are omitted from the overvoltage protection circuit 20 according to Embodiment 1, current paths in the case where a negative noise is applied to the communication bus line 42 are reduced by half. Therefore, the overvoltage reduction effect is halved. When a resistance value of the resistor R3 is reduced to half that in the case of Embodiment 1, a double current can be supplied to the current path, so the overvoltage reduction effect substantially equal to that in Embodiment 1 is obtained.

Even in this embodiment, the overvoltage reduction can be realized by using not the low-voltage Zener diodes but the high-withstand voltage MOS transistors, so the MOS transistors are easily embedded in the LSI circuit. When the protection elements are provided for the power supply voltage VCC, it is possible to solve the problem in that the current flowing from the bus line at the time of turning OFF the power supply increases. Therefore, the protection elements for VCC can be inserted to the system in which the inflowing current becomes a problem.

A resistance to outside noise increases, so a margin for an immunity (electromagnetic susceptibility: EMS) test becomes larger. Unlike Embodiment 1, this embodiment has an advantage in that the elements can be omitted.

It is apparent that the present invention is not limited to the above embodiments, but may be modified and changed without departing from the scope and spirit of the invention.

What is claimed is:

1. A bus driver device, comprising:
   a bus driver circuit connected to a bus line;
   a power supply wiring;
   an overvoltage protection section connected between the bus line and the power supply wiring, which has an overvoltage protection function for the bus line; and
   a switching circuit for on/off-controlling the overvoltage protection function based on a voltage of the bus line and a voltage of the power supply wiring,
   wherein the switching circuit comprises;
      a first transistor connected between the power supply wiring and the overvoltage protection section; and
      a control circuit for on/off-controlling the first transistor based on the voltage on the bus line, and
   wherein the overvoltage protection section comprises:
      a second transistor connected between the bus line and the first transistor, which has a back gate; and
      a third transistor connected between the back gate of the second transistor and the power supply wiring.

2. The bus driver device according to claim 1, wherein the control circuit comprises:
   a voltage detection section for detecting a voltage on the power supply wiring and the voltage on the bus line; and
   an inverter for on/off-controlling the first transistor based on a detection result obtained by the voltage detection section.

3. The bus driver device according to claim 1, wherein the control circuit further on/off-controls the third transistor based on the voltage on the bus line.

4. The bus driver device according to claim 1, further comprising a ground wiring,
   wherein the overvoltage protection section further comprises a fourth transistor connected between the bus line and the ground wiring.

5. A bus driver device, comprising:
   a bus driver circuit connected to a bus line;
   a power supply wiring;
   an overvoltage protection section connected between the bus line and the power supply wiring, which has an overvoltage protection function for the bus line; and
   a switching circuit for on/off-controlling the overvoltage protection function based on a voltage of the bus line and a voltage of the power supply wiring,
   wherein switching circuit comprises:
      a first transistor connected between the power supply wiring and the overvoltage protection section; and
      a control circuit for on/off-controlling the first transistor based on the voltage on the bus line,
   the bus driver device further comprising a ground wiring,
   wherein the control circuit comprises:
      a first voltage monitor section for monitoring the voltage on the bus line;
      a second voltage monitor section connected between the first voltage monitor section and the ground wiring, for monitoring a voltage on the power supply wiring; and
      an inverter for on/off-controlling the first transistor based on monitor results obtained by the first voltage monitor section and the second voltage monitor section.

6. A bus driver device comprising:
   a bus driver circuit connected to a bus line;
   a power supply wiring;
   an overvoltage protection section connected between the bus line and the power supply wiring, which has an overvoltage protection function for the bus line; and
   a switching circuit for on/off-controlling the overvoltage protection function based on a voltage of the bus line and a voltage of the power supply wiring,
   wherein the switching circuit comprises:
      a first transistor connected between the power supply wiring and the overvoltage protection section; and
      a control circuit for on/off-controlling the first transistor based on the voltage on the bus line, and
   wherein the control circuit comprises:
      a voltage detection section for detecting a voltage on the power supply wiring and the voltage on the bus line;
      an inverter for on/off-controlling the first transistor based on a detection result obtained by the voltage detection section; and
      a resistor connected between the bus line and the inverter.

* * * * *